United States Patent [19]
Jansen et al.

[11] Patent Number: 5,629,954
[45] Date of Patent: May 13, 1997

[54] SEMICONDUCTOR LASER DIODE WITH INTEGRATED ETALON

[75] Inventors: Michael Jansen, Torrance; Phillip D. Hayashida, Redondo Beach; Simon S. Ou, Manhattan Beach; Dennis P. Bowler, Hawthorne, all of Calif.

[73] Assignee: TRW Inc., Redondo Beach, Calif.

[21] Appl. No.: 329,017

[22] Filed: Oct. 25, 1994

[51] Int. Cl.$^6$ ............................................. H01S 3/18
[52] U.S. Cl. ......................... 372/43; 372/50; 372/98; 372/92; 372/19; 372/108
[58] Field of Search ................... 372/43, 50, 98, 372/108, 19, 97, 92

[56] References Cited

U.S. PATENT DOCUMENTS

| | | | |
|---|---|---|---|
| 4,550,410 | 10/1985 | Chenausky et al. | 372/97 |
| 4,622,672 | 11/1986 | Coldren et al. | 372/92 |
| 4,726,030 | 2/1988 | Fye | 372/92 |
| 4,790,635 | 12/1988 | Apsley | 350/356 |
| 4,815,084 | 3/1989 | Scifres et al. | 372/46 |
| 4,951,292 | 8/1990 | Kuindersma et al. | 372/49 |
| 5,063,566 | 11/1991 | Dixon | 372/22 |
| 5,070,505 | 12/1991 | Dixon | 372/22 |
| 5,103,456 | 4/1992 | Scifres et al. | 372/50 |
| 5,177,031 | 1/1993 | Buchmann et al. | 437/129 |
| 5,181,210 | 1/1993 | Chung et al. | 372/6 |
| 5,185,754 | 2/1993 | Craig et al. | 372/45 |
| 5,224,113 | 6/1993 | Tsang | 372/45 |
| 5,253,263 | 10/1993 | Jansen et al. | 372/50 |
| 5,285,468 | 2/1994 | Ackerman et al. | 372/96 |

FOREIGN PATENT DOCUMENTS

| | | | |
|---|---|---|---|
| 63-278393 | 11/1988 | Japan | 372/43 |

OTHER PUBLICATIONS

Jung et al, "Design of Integrated Mirror Etalons for Surface Emitting Lasers and Photonic Switching", Journal of the Korean Institute of Telematics and Electronics, vol. 29A (3), Mar. 1992, pp. 41–46.

Khitrova et al, "Integrated–Mirror Etalons for 1.3–um operation grown by molecular–beam epitaxy", J.Appl.Phys., vol. 69(9), 1 May 1991, pp. 6704–6706.

Maynard, William, "Single mode wavelength control of modulated AlGaAs lasers with external and internal etalon feedback", SPIE vol. 1044, pp. 89–96. Jan. 1989.

Fowles, Grant, "Introduction to Modern Optics", Dover Publications, New York, p. 90. 1968.

Primary Examiner—Rodney B. Bovernick
Assistant Examiner—Yisun Song
Attorney, Agent, or Firm—Michael S. Yatsko

[57] ABSTRACT

A single-frequency semiconductor laser diode structure and a method for its fabrication. The structure includes a built-in etalon, which limits the frequency of operation of the device to a very narrow frequency band. For an edge-emitting diode, the etalon is formed over a cleaved end face of the semiconductor diode structure, and light is emitted from an opposed cleaved end face. For a surface emitting diode, the etalon is formed as an additional plurality of layers between a plurality of semiconductor layers forming the diode and a substrate on which the structure is formed. Transverse channels formed in the structure have side surfaces that act as mirrors, at least one of which is angularly inclined to the plane of the active region, to reflect light through the etalon layers and out through a parallel exterior surface of the structure. Multiple surface emitting lasers may be arrayed in closely spaced relation to each other, to form a powerful light emitting array.

16 Claims, 3 Drawing Sheets

SEMICONDUCTOR LASER DIODE WITH INTEGRATED ETALON

BACKGROUND OF THE INVENTION

This invention relates generally to semiconductor lasers and, more particularly, to semiconductor laser diodes for applications requiring very low noise, single frequency operation. Laser diodes of this type are useful in such applications as coherent optical communication systems using either digital or radio-frequency analog technology, or in solid state pumping applications where precise wavelength control is required.

Basically, a semiconductor laser diode comprises an active semiconductor layer located at a diode junction, cladding layers surrounding the active layer in a sandwich-like fashion, and end mirrors of some kind located at opposite ends of the active layer. Photons generated in the active layer are substantially confined to the active layer by the surrounding cladding layers and are repeatedly reflected back and forth between the end mirrors. Laser light is emitted through one or both of the mirrors, in an edge emitting device, or in other designs there may be an inclined mirror to provide surface emission of the light. The nature of the laser cavity defined by the active layer and the mirrors is such that, in general, lasing may occur at more than one wavelength or mode of operation. Since sufficient gain for lasing may be typically achieved over a relatively wide bandwidth, the spectrum of light output from a conventional semiconductor laser diode consists of a number of peaks at various wavelengths. The multiple modes are less pronounced in continuous-wave (CW) operation than in pulsed operation, but are still present.

An early attempt to address this problem was a device known as the cleaved coupled cavity. To make this device, a semiconductor laser diode is cleaved into two parts, which are positioned side by side and optically coupled together in operation. Because the spectral positions of the multiple modes in each half of the device are not identical and overlapping, they tend to be eliminated from the spectrum of the pair operating together. By appropriate design, there is one mode that appears identically in both halves of the device. The cleaved coupled cavity has not, however, been made to operate reliably.

Another approach to attaining single-wavelength operation is to use feedback from a reflection grating located external to the laser cavity. If the grating is designed to reflect light only in an appropriately narrow bandwidth, this will confine lasing to a single desired longitudinal mode of operation. The difficulty is that, although this concept works well in a laboratory setting, it is difficult to build into a practical device. The grating has to be located approximately 10 cm from the laser diode and must, of course, be accurately position and aligned. Thus, the resulting device is highly sensitive to mechanical shock or vibration, and is much more bulky. The semiconductor laser diode itself is only a millimeter or so in length, but the grating must be positioned a hundred times that distance away from the laser. For these reasons, the use of grating feedback to obtain single frequency operation is not considered a practical solution.

Some designs have attempted to integrate grating reflectors onto the same substrate as the laser diode, but such structures are difficult to fabricate. A relatively low yield of devices is obtained from the fabrication process and the resulting devices are not reliable.

Another solution is to extend the laser cavity outside the semiconductor structure, using external mirrors to define the cavity instead of reflective cleaved facets of the semiconductor material. Then an etalon may be installed in the cavity, i.e. between the external mirrors, but outside the semiconductor structure defining the laser gain region. This approach has the same drawbacks as the grating feedback device, i.e., the device is more bulky and difficult to maintain in alignment.

Other attempts to integrate etalons into laser cavities include those described in U.S. Pat. No. 5,185,754 to Craig et al. and in U.S. Pat. No. 4,815,084 to Scifres et al. The Craig et al. patent discloses a waveguide structure in which an etalon is introduced by etching a channel through the waveguide and the Scifres et al. patent discloses a waveguide structure in which the effect of an etalon is achieved by means of changes in the effective index of refraction in a waveguide. A change in effective index is limited to less than 1%, which yields a mirror reflectivity of the order of only $2.5 \times 10^{-5}$. Etching through a waveguide yields a pair of reflective mirrors having reflectivities of approximately 30%. The effective reflectivity of such a pair of mirrors depends strongly on the device geometry and is, at best, about a 46% reflectivity. In addition to not providing high reflectivity, neither of these techniques affords precise control of the resulting etalon modes of oscillation, which is needed to control the wavelength of operation.

Accordingly, it will be appreciated that there is a need for further improvement in the field of semiconductor laser diodes. In particular, what is needed is a semiconductor laser diode having a basically single frequency of operation, but in a compact and rugged device that does not need to be maintained in alignment. The present invention satisfies this need.

SUMMARY OF THE INVENTION

The present invention resides in a semiconductor laser diode structure with a built-in etalon of which the thickness and other characteristics can be precisely controlled, to limit operation to a narrow frequency band. Briefly, and in general terms, the device of the invention comprises a semiconductor laser having a junction between semiconductor layers that together define a forward-biased diode, an active region in which lasing takes place, located at the junction of the diode, and integral mirrors arranged to reflect light back and forth through the active region; and an etalon structure built into the semiconductor laser diode and located to filter light in the active region, wherein the etalon is selected to transmit only light in a desired narrow frequency band.

In one embodiment of the invention, the semiconductor laser diode structure has opposed cleaved end faces. The laser diode emits light from one or both of the cleaved end faces, and the etalon structure is formed over one or both cleaved end faces of the laser diode structure. Basically, the etalon structure replaces what would normally be a reflective mirror at the end face.

In another embodiment of the invention, the laser diode emits light through a surface parallel to the active layer; and the etalon structure is formed in layers that are also parallel to the active layer. This embodiment includes two transverse channels formed in the semiconductor laser structure and extending in depth through the active region. The channels have surfaces coated with a material that enhances reflectivity, and at least one of the channels has a surface that is inclined to a plane normal to the plane of the active region, to reflect light through the light emitting surface of the structure. More specifically, in one embodiment one of the transverse channels has a surface perpendicular to the plane of the active region and the other of the transverse channels has a surface inclined at an angle of approximately 45° to the plane of the active region. Light from the active region is reflected through an angle of approximately 90°, passes through the etalon structure and is emitted through a surface of the diode. A symmetrical configuration similar to the one just described has two channels with inclined surfaces, to produce surface emission from both ends of the cavity. An etalon structure is formed over one or both of the channels and the substrate may or may not be removed from the region of surface emission.

Yet another embodiment of the invention includes one etalon structure through which light is reflected for surface emission, and an end-mirror etalon structure including a metal mirror for maximum reflection at the other end of the laser cavity.

In terms of a fabrication method, the invention in one of its forms comprises the steps of forming a plurality of semiconductor layers on a substrate, including an active region surrounded on two faces by optical cladding layers, wherein the active region is at the junction of a semiconductor diode; cleaving the resulting structure at opposed parallel end faces; forming an etalon structure on one of the end faces; and forming electrical connections across the diode; wherein the etalon structure forces the diode to operate at a single frequency.

Another embodiment of the method comprises the steps of forming an etalon structure over a substrate; forming a plurality of semiconductor layers over the etalon, including an active region surrounded on two faces by optical cladding layers, wherein the active region is at the junction of a semiconductor diode; forming two generally parallel transverse channels in the semiconductor layers, the channels extending in depth through the active region; and forming reflective side surfaces on the channels, to reflect light from the active region. At least one of the channels has a side surface that is inclined at an angle of approximately 45° to the plane of the active region, to reflect light through an angle of approximately 90° and out through the etalon structure and through an exterior surface of the structure, at a single selected frequency.

It will be appreciated from the foregoing that the present invention represents a significant advance in the field of semiconductor laser diodes. In particular, the invention provides a semiconductor laser diode for operation at a single frequency, but without the inconvenience of external gratings or etalons. Instead, an etalon is integrated into the chip on which the diode is fabricated, so the resulting device is extremely robust and reliable. Other aspects and advantages of the invention will become apparent from the following more detailed description, taken in conjunction with the accompanying drawings.

DESCRIPTION OF THE PREFERRED EMBODIMENTS

Figure 1:
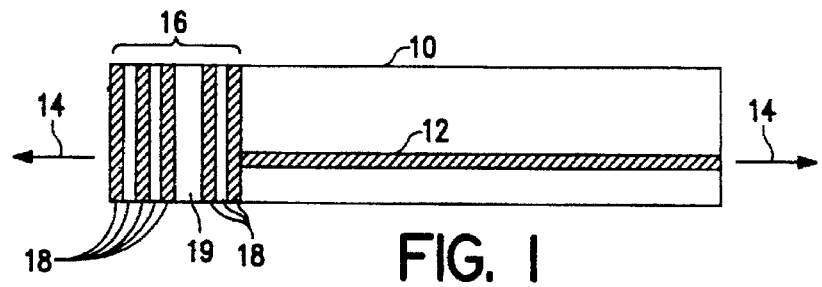
FIG. 1 is a diagrammatic cross-sectional view of a semiconductor laser diode in accordance with the invention.

As shown in the drawings for purposes of illustration, the present invention is concerned with an improved semiconductor laser diode structure. As is well known, a conventional semiconductor laser diode is inherently capable of operating in many longitudinal or cavity modes. Unless the device is somehow constrained to operate in only one mode, the laser output will emit light at different wavelengths simultaneously, or may change wavelengths as the temperature changes. These characteristics are undesirable and unacceptable for some applications of semiconductor lasers, such as in coherent optical communications.

In the past, the use of cleaved coupled cavities, grating feedback devices, and external mirrors with intracavity etalons, have not provided a practical solution to the problem. Other designs have provided intracavity etalons by etching through a waveguide or building in a change in its effective index of refraction. Such etalons provide limited reflectivity and imprecise control of the modes of operation of the laser. In accordance with the present invention, a semiconductor laser diode is provided with an integral etalon structure of which the thickness and other characteristics can be precisely controlled, to constrain lasing to take place in only one frequency or mode.

FIG. 1 shows the device of the invention in diagrammatic form. A conventional diode structure is used, including a semiconductor substrate, indicated by reference numeral 10 and an active region 12. Laser light is emitted from an edge of the active region, at one or both ends of the structure, as indicated by the arrows 14. At one end of the structure, a passive dielectric etalon 16 is formed integrally with the semiconductor structure, with the etalon having multiple coplanar layers 18 that are perpendicular to the layers of the diode structure. The etalon 16 may be asymmetric in design, including a spacer 19 and a different number of layers 18 on each side of the spacer.

Figure 8:
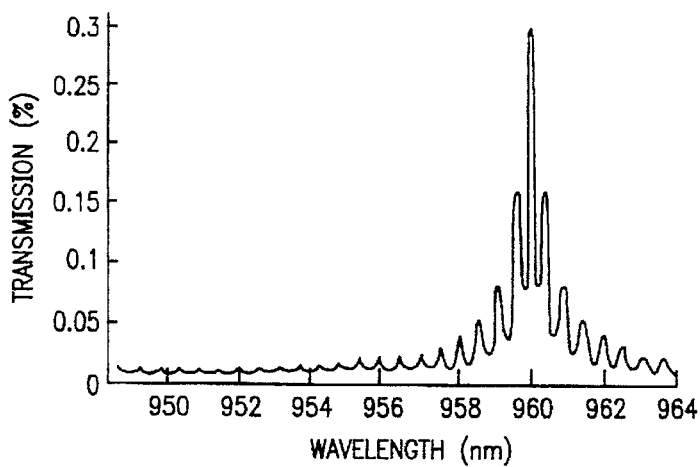
FIG. 8 is a graph showing the spectral transmission characteristic of an etalon as used in the present invention.

The etalon 16 is designed to provide mode discrimination by its transmission spectrum, shown for example in FIG. 8. The etalon structure consists of alternating layers 18 of two different dielectric materials of selected thickness. More specifically, the etalon structure has N pairs of layers 18 with high and low indices of retraction, each pair being a quarter-wavelength thick, then the spacer 19, which may be as small as one half-wavelength in thickness, and followed by N+1 pairs of quarter-wavelength layers. The spacer 19 may, for some applications, be of a nonlinear optical material with nonlinear phase or gain characteristics. Table 1 gives the specific dimensions for one example of a passive dielectric etalon.

TABLE 1

| Material | Thickness (μm) | Description |
| --- | --- | --- |
| Diode facet | | |
| MgF$_2$ | 0.174819 | N pairs λ/4 stack |
| Ta$_2$O$_5$ | 0.114881 | |
| . | | |
| . | | |
| . | | |
| MgF$_2$ | 0.174819 | |
| Ta$_2$O$_5$ | 0.229762 | Half-wave spacer |
| MgF$_2$ | 0.174819 | |
| Ta$_2$O$_5$ | 0.114881 | (N + 1) λ/4 stack |
| . | | |
| . | | |
| . | | |
| Air | | |

Figure 2:
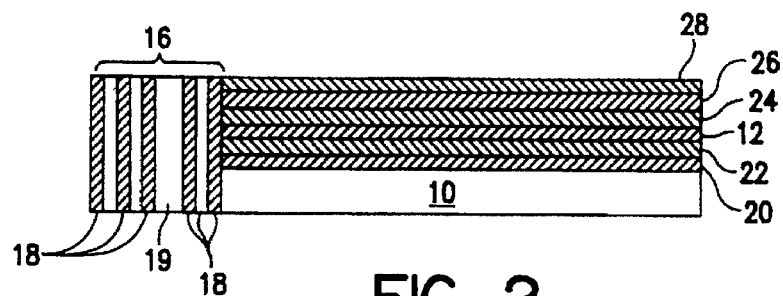
FIG. 2 is a more detailed cross-sectional view of the device of FIG. 1.

FIG. 2 shows the embodiment of FIG. 1 in more detail. The laser diode is fabricated in a conventional manner by forming various layers over the substrate 10, which is shown inverted from the position of FIG. 1. By way of example, the substrate may be gallium arsenide (GaAs). First a buffer layer 20, such as GaAs, is formed on the substrate 10; then a first cladding layer 22 is formed over the buffer layer. The cladding layer in a GaAs device is typically of gallium aluminum arsenide (GaAlAs). Next the active region 12, e.g. of GaAs, is formed over the first cladding layer 22, and is typically about 100 Å (angstroms) thick. A second cladding layer 24 is formed over the active region 12 and then a cap layer 26 is formed over that to provide electrical contact. A metallization layer 28 is formed over the cap layer 26 and another metal layer (not shown) is formed on the opposite face of the structure to provide for the supply of electrical power across the metal layers.

Figure 6A:
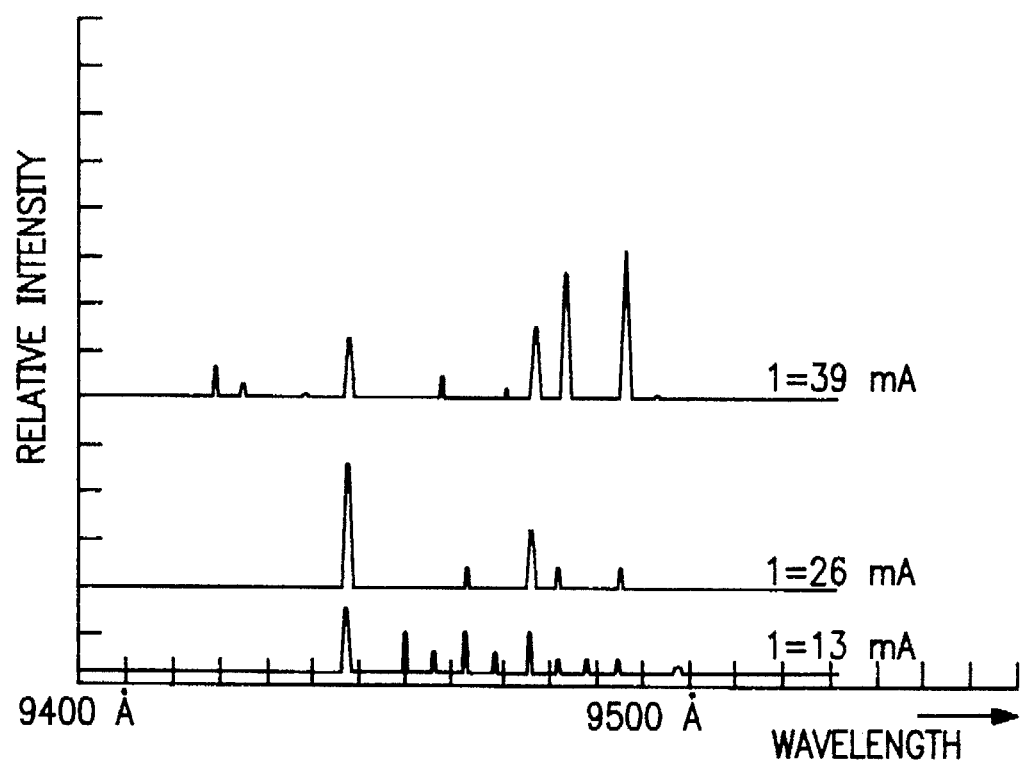
FIG. 6A is a graph showing the spectral output of a semiconductor laser diode in pulsed mode, without the improvement of the invention.
Figure 6B:
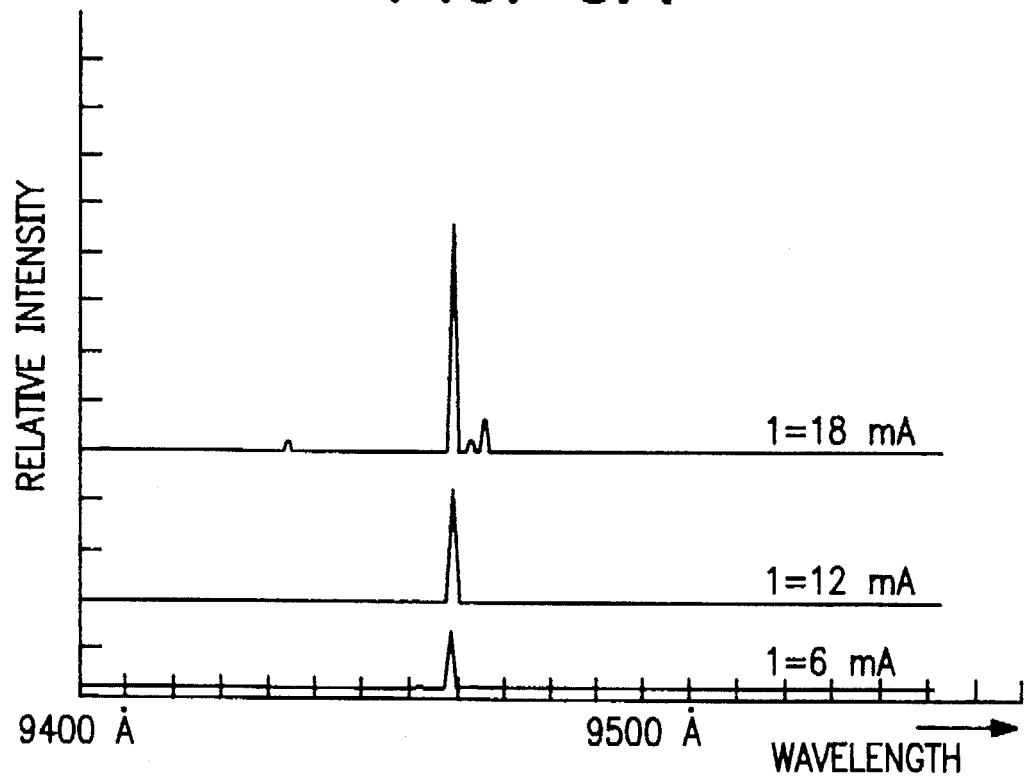
FIG. 6B is a graph showing the spectral output of a semiconductor laser diode in pulsed mode, using the structure of the invention.
Figure 7A:
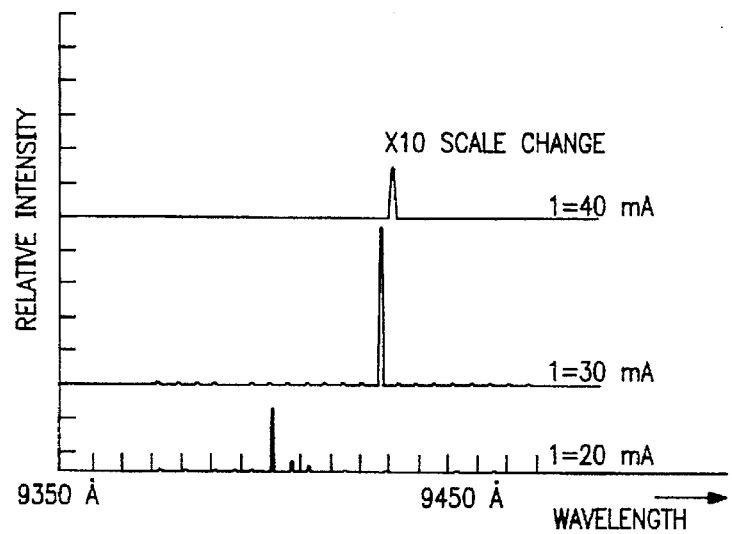
FIGS. 7A and 7B are spectral output graphs similar to FIGS. 6A and 6B but for continuous wave (CW) operation.
Figure 7B:
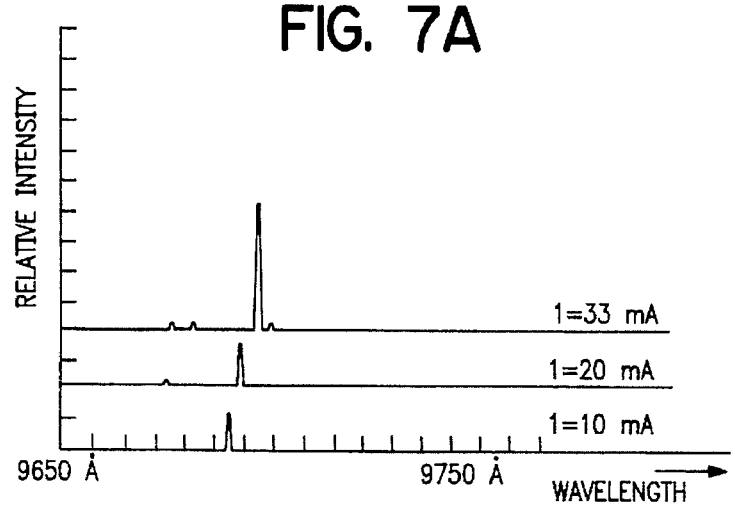

As is also conventional, after fabrication the structure is inverted to place the active region 12 closer to the bottom. This "junction down" orientation facilitates cooling of the device by mounting it on a heat sink (not shown). The substrate 10 is usually lapped and polished to reduce the overall thickness of the structure to about 100 μm, and the end faces are then cleaved to produce a clean continuous surface. Normally, these end faces are coated with an appropriate reflective coating to act as mirrors. In the present invention, however, the etalon 16 is formed on one of the end faces of the fabricated laser diode structure. The etalon 16, as discussed above, consists of a number of pairs of layers 18 of a quarter of a selected wavelength. The etalon layers may be formed by evaporation, sputtering or other appropriate process. Because the etalon 16 transmits light only close to the selected wavelength, as shown in FIG. 8, it has the effect of selecting a single mode of oscillation for the laser, as best shown in FIGS. 6B and 7B.

Figure 3:
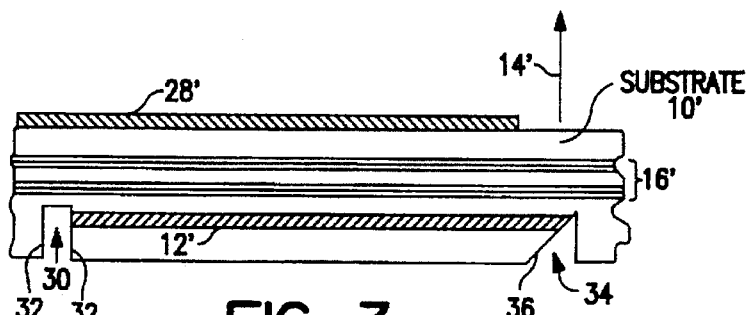
FIG. 3 is a diagrammatic cross-sectional view of an alternate embodiment of the invention, providing surface emission of light.

An alternative embodiment of the invention is shown in FIG. 3. In this structure, an etalon 16' is formed over a substrate 10'. Then the various conventional layers of a laser diode are formed over the etalon 16', including an active region 12'. A transverse channel 30 is formed in laser diode structure, using, for example, a reactive ion etching process. The channel 30 has parallel side faces 32 and extends through the active region 12'. One of the side faces 32 acts as a mirror for the laser cavity formed by the active region 12'. A second transverse channel 34 is formed in the laser diode structure parallel to the first channel 30 and also extends through the active region 12'. The second channel 34 differs from the first in that it has an inclined side face 36, preferably at 45° to the plane of the active layer 12'.

Therefore, light in the active region 12' is reflected through 90° by the inclined channel side face 36 and into the etalon 16'. The etalon 16' functions similarly to the etalon 16 in FIG. 1 and the structure produces an output at the desired wavelength, as indicated by the arrow 14'. A metallization layer 28' does not extend over the area in which light is emitted.

Figure 4:
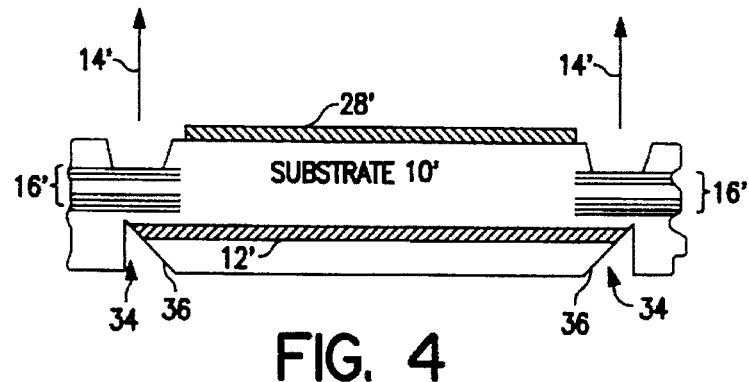
FIG. 4 is a view similar to FIG. 3 but showing another alternate embodiment of the invention, with surface emission from both ends of a laser cavity.

FIG. 4 is a variant of the embodiment of FIG. 3, but instead of the parallel-sided channel 30 this embodiment includes a channel 34' with a sloping sidewall 36', from which light is reflected for surface emission from a second location. The substrate 10' has been removed from the areas of surface emission, as may be required for some applications. The etalon structure 16' is shown as being absent from a region beneath the metallization layer 28', which may also be desirable for some applications. The remaining etalon structure is shown as being present at both ends of the device, but it will be appreciated that some designs may require an etalon at just one of the ends.

Figure 5:
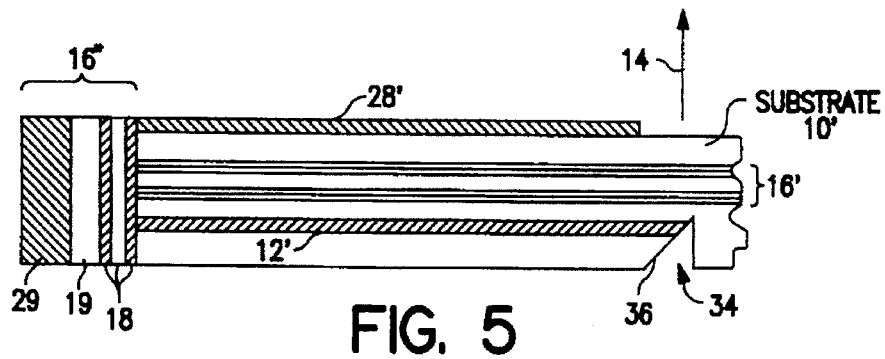
FIG. 5 is diagrammatic cross-sectional view of yet another embodiment of the invention.

FIG. 5 shows yet another variant of the embodiment of FIG. 3. Instead of a the channel 30 to provide reflection at one end of the laser cavity, this embodiment includes an end-mirror etalon 16", including one set of etalon layers 18, a spacer layer 19, and a metal mirror 29 over the spacer. The metal mirror provides complete reflection and no light is emitted from this end of the laser cavity.

The surface emitting configurations of FIGS. 3, 4 and 5 have a number of distinct advantages over the edge emitting version. One important advantage is that, because the longitudinal modes of a cavity are determined by its length, it is easier to predetermine the modes of the surface emitting structure. The cavity length of the surface emitting configuration is defined largely by a photolithographic or similar process, but the end mirrors of the edge emitting configuration are defined by cleaved end mirrors, which are inherently much less precisely positioned than photolithographically determined features. In addition, the surface emitting configurations lend themselves to the formation of a powerful array of emitting surface areas on a single semiconductor wafer. Building an array of edge emitting devices requires placing multiple laser diodes in a three-dimensional stack. Electrical connections within the stack may then be difficult to make, and the elements of the stack must be carefully aligned. A surface emitting array, on the other hand, has all its elements arrayed in one plane and electrical diode connections can be easily made.

Use of the etalon structure of the invention avoids another drawback associated with laser diodes of the prior art. Thermal effects as the device heats up result in a significant red-shift of the emission wavelength due to a change in the index of refraction of the active region material. Without the etalon, the mode "hops" from one longitudinal mode to the next as the laser junction heats up. With the etalon 16 installed, the output frequency is locked to the etalon design frequency.

Another advantage of the invention over the prior art is that it allows greater reflectivities to be achieved, by employing multilayer structures with materials having large index differences. A high reflectance mirror can also be employed for one of the cavity mirrors, to provide the desired mode discrimination. The multilayer etalon of the invention achieves reflectivities greater than 90%, as compared with only about 46% or less for pairs of facet mirrors formed by etching, and much lower reflectivities obtained in waveguides in which there are changes in effective index. Another measure of etalon quality is the cavity finesse, F.

For a simple lossless symmetric Fabry-Perot etalon with mirror reflectivity R, the cavity finesse is given by: $F=4R/(1-R)^2$. Thus, for the prior art etalons using index changes and etched waveguide channels, in which the best achievable reflectivities are $2.5\times10^{-5}$ and 46%, respectively, the finesse values are 0.0001 and 6.3, respectively. For the present invention, which can achieve reflectivities greater than 90%, the finesse is in excess of 360.

Yet another advantage of the present invention is the improvement it offers in control over etalon modes by precise control of the etalon thickness, which strongly influences laser wavelength. This is an important consideration for diode pump lasers for solid-state and fiber-optic amplifier applications, which require specific pump wavelengths for optimum performance. Further, because the etalon structure of the present invention can be conveniently made using conventional precision fabrication technologies, production yields are significantly higher than for etalon structures of the prior art.

It will be appreciated frown the foregoing that the present invention represents a significant advance in the field of laser diodes. In particular, the invention provides a laser diode structure with an integral etalon to force operation at a single desire frequency. It will also be appreciated that, although a number of embodiments of the invention have been described in detail for purposes of illustration, various modifications may be made without departing from the spirit and scope of the invention. Accordingly, the invention should not be limited except as by the appended claims.

We claim:

1. A semiconductor laser diode structure for single-frequency operation, the structure, comprising:
   a semiconductor laser having a junction between semiconductor layers that together define a forward-biased diode, an active region in which lasing takes place, located at the junction of the diode, and integral mirrors arranged to reflect light back and forth through the active region; and
   a multilayer etalon structure of which the thickness and other characteristics can be precisely controlled, built into the semiconductor laser diode and located to filter light in the active region, wherein the etalon is selected to transmit only light in a desired narrow frequency band;
   and wherein the multilayer etalon structure includes multiple etalons.

2. A semiconductor laser diode structure as defined in claim 1, wherein:
   the semiconductor diode structure has opposed cleaved end faces;
   the laser diode emits light from at least one of the cleaved end faces, through at least one end of the active layer; and
   the etalon structure is formed over at least one cleaved end face of the laser diode structure, whereby the etalon structure replaces what would normally be a reflective mirror at the end face.

3. A semiconductor laser diode structure for single-frequency operation, the structure, comprising:
   a semiconductor laser having a junction between semiconductor layers that together define a forward-biased diode, an active region in which lasing takes place, located at the junction of the diode, and integral mirrors arranged to reflect light back and forth through the active region; and
   a multilayer etalon structure of which the thickness and other characteristics can be precisely controlled, built into the semiconductor laser diode and located to filter light in the active region, wherein the etalon is selected to transmit only light in a desired narrow frequency band;
   and wherein the laser diode emits light through a surface parallel to the active layer;
   and wherein the etalon structure is formed in layers that are also parallel to the active layer.

4. A semiconductor laser diode structure as defined in claim 3, and further comprising:
   two transverse channels formed in the semiconductor laser structure and extending in depth through the active region, wherein at least one of the channels has a surface that is inclined to the plane of the active region, to reflect light through the light emitting surface of the structure.

5. A semiconductor laser diode structure as defined in claim 4, wherein:
   one of the transverse channels has a surface perpendicular to the plane of the active region and the other of the transverse channels has a surface inclined at an angle of approximately 45° to the active region, whereby light from the active region is reflected through an angle of approximately 90°, passes through the etalon structure and is emitted through a surface of the diode.

6. A semiconductor laser diode structure as defined in claim 4, wherein:
   each of the transverse channels has a surface inclined at an angle of approximately 45° to the active region, whereby light from the active region is reflected through an angle of approximately 90° at each end of the active region, and is emitted through a surface of the diode.

7. A semiconductor laser diode structure as defined in claim 6, wherein:
   the etalon structure extends over at least one of the transverse channels, to provide desired mode selectivity of the emitted light.

8. A semiconductor laser diode structure as defined in claim 4, wherein:
   the semiconductor laser diode structure is formed on a substrate; and
   a portion of the substrate is removed near the light-emitting surface of the structure.

9. A semiconductor laser diode structure for single-frequency operation, the structure, comprising:
   a semiconductor laser having a junction between semiconductor layers that together define a forward-biased diode, an active region in which lasing takes place, located at the junction of the diode, and integral mirrors arranged to reflect light back and forth through the active region; and
   a multilayer etalon structure of which the thickness and other characteristics can be precisely controlled, built into the semiconductor laser diode and located to filter light in the active region, wherein the etalon is selected to transmit only light in a desired narrow frequency band;
   and wherein the laser diode includes a transverse channel formed in the semiconductor laser structure and extending in depth through the active region, the channel including a surface inclined at an angle of approximately 45° to the plane of the active layer, to reflect light toward a surface parallel to the active layer;
   and wherein the etalon structure includes a first etalon formed as multiple layers parallel to the active layer in a region adjacent to the transverse channel, to provide one laser cavity end mirror, and a second etalon formed as multiple layers over a cleaved end face of the laser diode structure, to provide a second laser cavity end mirror.

10. A semiconductor laser diode structure as defined in claim 9, wherein:

the second etalon includes a metal mirror preventing emission of light through the second etalon.

11. A semiconductor laser diode structure for single-frequency operation, the structure comprising:

a plurality of generally parallel semiconductor layers forming a laser diode and having a planar active region at the diode junction, the semiconductor layers being cleaved across two opposed end faces of the structure; and an integrated etalon structure formed across at least one of the end faces, the etalon structure being designed to transmit light at only over a narrow band of frequencies;

wherein laser light emitted from at least one end face of the semiconductor structure is limited to the narrow transmission band of the integrated etalon structure;

and wherein the etalon structure includes two sets of multiple dielectric layers of alternating high and low indices of refraction, the two sets of layers being separated by a spacer of greater thickness.

12. A semiconductor laser diode structure as defined in claim 11, wherein:

the layers of the etalon structure have a thickness of approximately one-fourth of a desired wavelength; and the spacer thickness is approximately one-half of a wavelength.

13. A surface emitting semiconductor laser diode structure for single frequency operation, the structure comprising:

a plurality of generally parallel semiconductor layers formed on a semiconductor substrate and including a planar active region and means for applying an electrical voltage across the diode structure;

a plurality of layers of dielectric material forming an etalon and formed integrally with the laser diode structure, between the parallel semiconductor layers and the semiconductor substrate; and at least two transverse channels formed in the semiconductor layers and extending in depth through the active region;

wherein at least one of the transverse channels has a reflective surface that is inclined to a direction normal to the plane of the active region, to reflect light of a single frequency out of the structure through a surface that is parallel to the semiconductor layers.

14. A surface emitting semiconductor laser diode structure as defined in claim 13, wherein:

one of the transverse channels has a reflective surface that is perpendicular to the plane of the active region, to reflect light back into the active layer; and the other of the transverse channels has a reflective surface at 45° to the plane of the active region.

15. A surface emitting semiconductor laser diode structure as defined in claim 13, and further comprising:

a plurality of additional laser diode structures formed in the same semiconductor layers and on a single substrate, wherein the plurality of laser diode structures form an array of closely spaced single-frequency light sources.

16. A method of fabricating a surface emitting laser diode structure having a single frequency of operation, the method comprising the steps of:

forming an etalon structure over a substrate;

forming a plurality of semiconductor layers over the etalon, including an active region surrounded on two faces by optical cladding layers, wherein the active region is at the junction of a semiconductor diode;

forming at least one generally parallel transverse channel in the semiconductor layers, the channel extending in depth through the active region; and wherein the channel has a side surface that is inclined at an angle of approximately 45° to the plane of the active region, to reflect light through an angle of approximately 90° and out through the etalon structure and through an exterior surface of the structure, at a single selected frequency.

* * * * *